(12) United States Patent
Owsley et al.

(10) Patent No.: US 7,353,444 B2
(45) Date of Patent: Apr. 1, 2008

(54) LDPC ARCHITECTURE

(75) Inventors: Patrick A. Owsley, Moscow, ID (US);
Brian A. Banister, Pullman, WA (US);
Tom Hansen, Pullman, WA (US)

(73) Assignee: Comtech AHA Corporation, Moscow, ID (US)

( * ) Notice: Subject to any disclaimer, the term of this patent is extended or adjusted under 35 U.S.C. 154(b) by 440 days.

(21) Appl. No.: 11/123,671

(22) Filed: May 6, 2005

(65) Prior Publication Data

US 2005/0258984 A1 Nov. 24, 2005

Related U.S. Application Data

(60) Provisional application No. 60/568,939, filed on May 7, 2004.

(51) Int. Cl.
*H03M 13/45* (2006.01)

(52) U.S. Cl. ........................ 714/752; 714/780

(58) Field of Classification Search ................ 714/780, 714/752
See application file for complete search history.

(56) References Cited

U.S. PATENT DOCUMENTS 7,181,676 B2 * 2/2007 Hocevar .................... 714/780
7,237,171 B2 * 6/2007 Richardson ................ 714/752
2003/0104788 A1 * 6/2003 Kim ........................ 455/67.3
2004/0093554 A1 * 5/2004 Hung ....................... 714/801

OTHER PUBLICATIONS

Mansour, M., "Unified Decoder Architectures for Repeat-Accumulate and LDPC Codes", 2004 Asilomar Conference on Signals, Systems and Computers, Nov. 2004, pp. 527-531.*

* cited by examiner

*Primary Examiner*—Stephen M. Baker
(74) *Attorney, Agent, or Firm*—Duncan Palmatier

(57) ABSTRACT

The current invention involves a forward error detection system, especially for use with Low Density Parity Check codes. A parallel SISO structure allows the decoder to process multiple parity equations at the same time. There is a new SISO decoder which allows for the updating of the Log-likelihood-ratios in a single operation, as opposed to the two pass traditionally associated with the Tanner Graphs. In the decoder, there is a mapping structure that correctly aligns the stored estimates, the stored differences and the SISOs. There is also the ability to deal with multiple instances of the same data being processed at the same time. This structure manages the updates and the differences in such a manner that all calculations on a single piece of data that are processed in parallel are incorporated correctly in the new updated estimates.

35 Claims, 13 Drawing Sheets $$H = \begin{bmatrix} 1 & 1 & 1 & 1 & 0 & 1 & 0 & 0 & 0 & 1 \\ 0 & 1 & 1 & 0 & 1 & 1 & 1 & 0 & 0 & 0 \\ 1 & 0 & 0 & 1 & 1 & 0 & 1 & 1 & 0 & 0 \\ 1 & 1 & 0 & 1 & 0 & 0 & 0 & 1 & 1 & 0 \\ 0 & 0 & 1 & 0 & 1 & 0 & 0 & 0 & 1 & 1 \end{bmatrix} \begin{matrix} \text{row 0} \\ \text{row 1} \\ \text{row 2} \\ \text{row 3} \\ \text{row 4} \end{matrix}$$

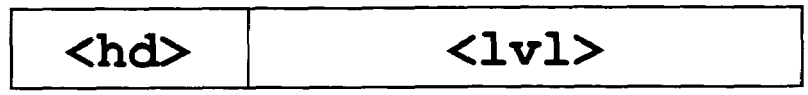
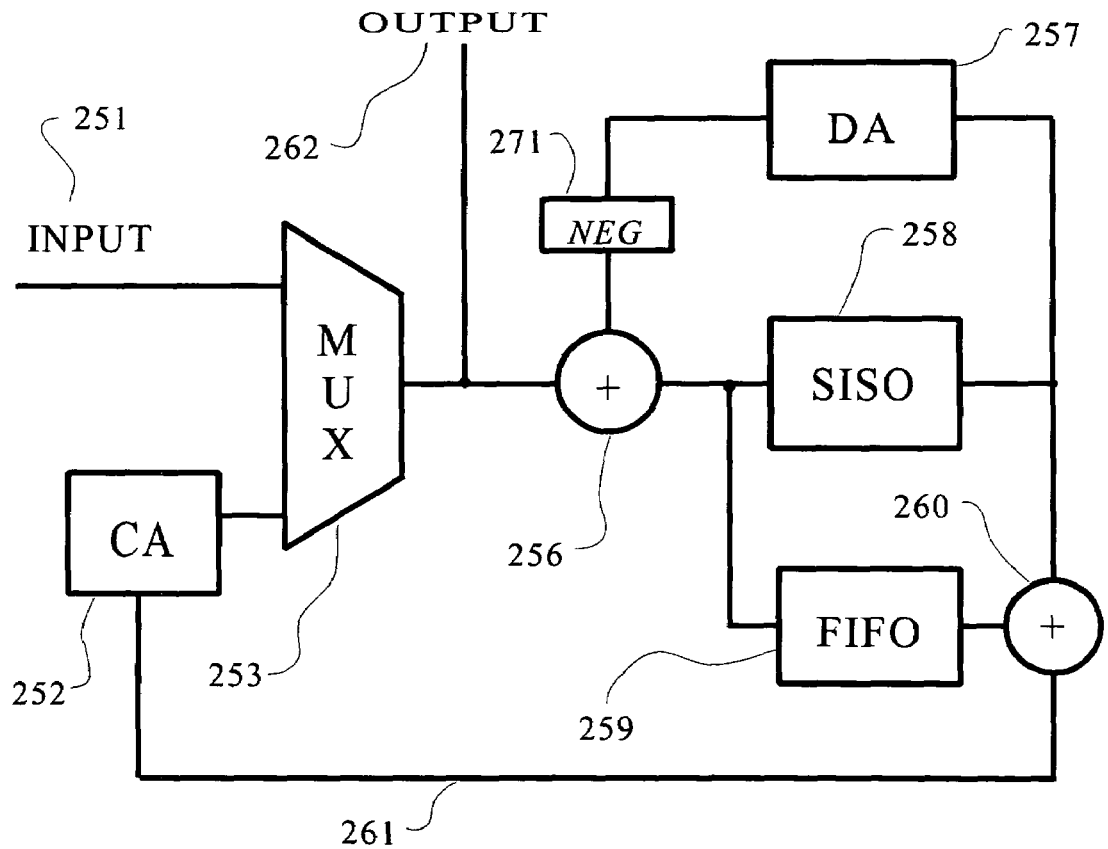
Fig. 2
Fig. 3a

303

| $P_1$ | $P_2$ | $P_3$ | $P_4$ | $P_5$ | $P_6$ |
|---|---|---|---|---|---|
| $\begin{bmatrix} 1 & 0 & 0 \\ 0 & 1 & 0 \\ 0 & 0 & 1 \end{bmatrix}$ | $\begin{bmatrix} 1 & 0 & 0 \\ 0 & 0 & 1 \\ 0 & 1 & 0 \end{bmatrix}$ | $\begin{bmatrix} 0 & 1 & 0 \\ 1 & 0 & 0 \\ 0 & 0 & 1 \end{bmatrix}$ | $\begin{bmatrix} 0 & 0 & 1 \\ 1 & 0 & 0 \\ 0 & 1 & 0 \end{bmatrix}$ | $\begin{bmatrix} 0 & 1 & 0 \\ 0 & 0 & 1 \\ 1 & 0 & 0 \end{bmatrix}$ | $\begin{bmatrix} 0 & 0 & 1 \\ 0 & 1 & 0 \\ 1 & 0 & 0 \end{bmatrix}$ |

301

| | | | | | |
|---|---|---|---|---|---|
| Input  a b c | a b c | a b c | a b c | a b c | a b c |
| Output a b c | a c b | b a c | c a b | b c a | c b a |

Possible permutations for 3 items

ROW₀    2 3 0 5 0 1 0 0 0 4
ROW₁    0 6 4 0 3 1 1 0 0 0
ROW₂    4 0 3 6 0 0 1 1 0 0
ROW₃    5 2 0 0 6 0 0 1 1 0
ROW₄    0 0 5 2 4 0 0 0 1 1

ROW₀ = (0,2) + (1,3) + (3,5) + (5,1) + (9,4)
ROW₁ = (1,6) + (2,4) + (4,3) + (5,1) + (6,1)
ROW₂ = (0,4) + (2,3) + (3,6) + (6,1) + (7,1)
ROW₃ = (0,5) + (1,2) + (4,6) + (7,1) + (8,1)
ROW₄ = (2,5) + (3,2) + (4,4) + (8,1) + (9,1)

|   | 1 | 2 | 3 | 4 | 5 | 6 |
|---|---|---|---|---|---|---|
| 1 | 1 | 2 | 3 | 4 | 5 | 6 |
| 2 | 2 | 1 | 5 | 6 | 3 | 4 |
| 3 | 3 | 4 | 1 | 2 | 6 | 5 |
| 4 | 4 | 3 | 6 | 5 | 1 | 2 |
| 5 | 5 | 6 | 2 | 1 | 4 | 3 |
| 6 | 6 | 5 | 4 | 3 | 2 | 1 |

B on left side 362                                          360

Fig. 8

Permutation A followed by Permutation B

373

371

372

| | ROW 0 | ROW 1 | ROW 2 | ROW 3 | ROW 4 |
|---|---|---|---|---|---|
| $C_0$ | $P_2$ | $P_2$ | $P_4$ | $P_5$ | $P_5$ |
| $C_1$ | $P_3$ | $P_6$ | $P_6$ | $P_2$ | $P_2$ |
| $C_2$ | $P_1$ | $P_4$ | $P_3$ | $P_3$ | $P_5$ |
| $C_3$ | $P_5$ | $P_5$ | $P_6$ | $P_6$ | $P_2$ |
| $C_4$ | $P_1$ | $P_3$ | $P_3$ | $P_6$ | $P_4$ |
| $C_5$ | $P_1$ | $P_1$ | $P_1$ | $P_1$ | $P_1$ |
| $C_6$ | $P_1$ | $P_1$ | $P_1$ | $P_1$ | $P_1$ |
| $C_7$ | $P_1$ | $P_1$ | $P_1$ | $P_1$ | $P_1$ |
| $C_8$ | $P_1$ | $P_1$ | $P_1$ | $P_1$ | $P_1$ |
| $C_9$ | $P_4$ | $P_4$ | $P_4$ | $P_4$ | $P_1$ |

Fig. 9

Permutations for a complete iteration as they are stored in CA memory after each ROW equation is evaluated

382 —

| | |
|---|---|
| $D_{0,0}$ | $P_2$ — 383 |
| $D_{0,1}$ | $P_3$ |
| $D_{0,3}$ | $P_5$ |
| $D_{0,5}$ | $P_1$ |
| $D_{0,9}$ | $P_4$ |
| | |
| $D_{1,1}$ | $P_6$ |
| $D_{1,2}$ | $P_4$ |
| $D_{1,4}$ | $P_3$ |
| $D_{1,5}$ | $P_1$ |
| $D_{1,6}$ | $P_1$ |
| | |
| $D_{2,0}$ | $P_4$ |
| $D_{2,2}$ | $P_3$ |
| $D_{2,3}$ | $P_6$ |
| $D_{2,6}$ | $P_1$ |
| $D_{2,7}$ | $P_1$ |
| | |
| $D_{3,0}$ | $P_4$ |
| $D_{3,4}$ | $P_3$ |
| $D_{3,5}$ | $P_6$ |
| $D_{3,7}$ | $P_1$ |
| $D_{3,8}$ | $P_1$ |
| | |
| $D_{4,2}$ | $P_5$ |
| $D_{4,3}$ | $P_2$ |
| $D_{4,4}$ | $P_4$ |
| $D_{4,8}$ | $P_1$ |
| $D_{4,9}$ | $P_1$ |

Permutations as they are stored in the DA memory

The minimum function

Sign bit data path of the SISO

Magnitude field data path of the SISO

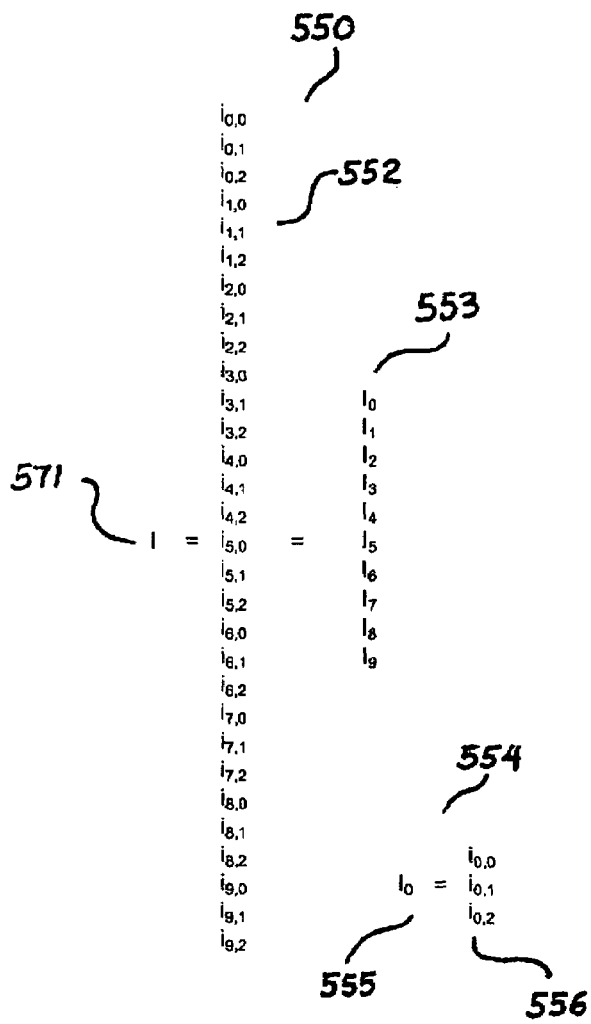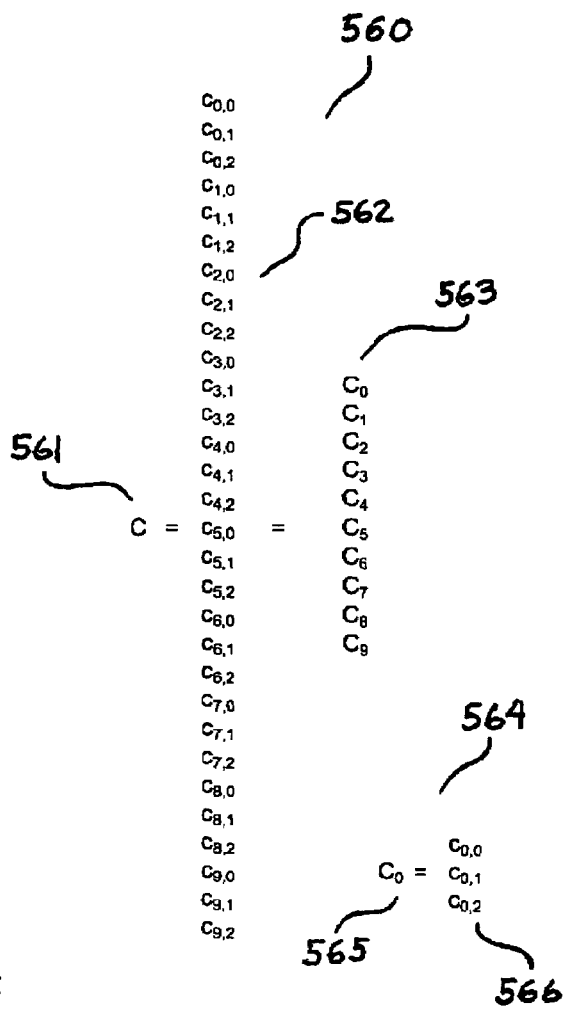
Figure 13                    Figure 14 m parallelism that handles multiplicities

LDPC ARCHITECTURE

CLAIM OF PRIORITY TO PROVISIONAL APPLICATION (35 U.S.C. § 119(e))

This application claims priority under 35 U.S.C. § 119(e) from provisional patent Application No. 60/568,939, filed May 7, 2004. The 60/568,939 Application is incorporated herein by reference.

FIELD OF THE INVENTION

The present invention relates to error correction systems for computer data. More specifically, the invention relates to the use of parity check codes such as a low density parity check code ("LDPC").

BACKGROUND OF THE INVENTION

The transmission of binary computer data involves the introduction of errors, which must be detected and corrected, if possible. Although the difference between the two binary values, zero and one, seems clear, like the difference between black and white, in practice an electronic device may have difficulty distinguishing the difference. The difference between binary values may be detected as a voltage difference, but electronic noise in a circuit can interfere and render the difference less certain. This uncertainty must be dealt with. One option is to reject the data input and request retransmission. However, this is impossible with some fast flowing digital signals with substantial volume, such as digital TV, and is impractical in many situations. Accordingly, error correction systems have been developed to detect and correct errors. Communication systems often use forward error correction to correct errors induced by noise in the channel. In such systems, the error correction occurs at the receiver. One such system is parity check coding. One example of parity check coding is "low density parity check" coding ("LDPC").

Forward error correction consists of adding redundancy to data. Block codes, such as the LDPC codes, segment the data into blocks. These blocks have additional bits added according to a specified algorithm, to create a codeword. This codeword is transmitted to the receiver over the channel. The data that is transmitted is binary in nature, meaning that it is either a logical "1" or a logical "0". Noise is added by the channel, and the receiver detects each of the bits of the codeword and makes a best initial determination as to whether the bit is a logical 1 or 0. The receiver might also have the ability to assign a confidence in its guess. These guesses are called soft bits.

When a receiver gets a codeword, it is processed. The coding information added to original data is used to detect and correct errors in the received signal and thereby recover the original data. For received values with errors, the decoding system will attempt to recover or generate a best guess as to the original data.

As noted above, the receiver can reject data input containing errors. Retransmission may increase the reliability of the data being transmitted or stored, but such a system demands more transmission time or bandwidth or memory, and in some applications, such as digital TV signals, it may be impossible with current technology. Therefore, it is highly desirable to perfect error detection and correction of transmitted data.

LDPC systems use an iterative decoding process which is particularly suitable for long codewords. In general, LDPC codes offer greater coding gains than other, currently available codes. The object is to use parallel decoding in the LDPC's iterative process to increase speed. In order to accomplish this, the inherent parallelism of an LDPC code must be found and exploited. There is also a need to reduce the amount of memory accesses and total memory required per iteration. To make the LDPC coding work as efficiently and quickly as possible, careful attention must be drawn to the storage of data and routing the data to the storage during the iterations.

U.S. Pat. No. 6,633,856 to Richardson et al. ("Richardson"), discloses two LDPC decoder architectures, a fast architecture and a slower architecture. In the slow architecture, a single iteration consists of two cycles. There is an edge memory consisting of one location for each edge in the Tanner Graph or, equivalently, there is one location for each 1 in the H matrix. There is also an input buffer which requires a memory location for each input variable, or equivalently, there is a memory location for each column of the H matrix. The two memories do not require the same resolution, the high resolution memory is the edge memory, and the low resolution memory is the input buffer. In the fast architecture, a single iteration consists of a single memory cycle. There are two edge memories and a single input buffer required.

SUMMARY OF THE INVENTION

The current invention involves a parallel SISO structure that allows the decoder to process multiple parity equations at the same time. There is a new SISO decoder which allows for the updating of the Log-likelihood-ratios in a single operation, as opposed to the two pass traditionally associated with the Tanner Graphs. In the decoder, there is a mapping structure that correctly aligns the stored estimates to the stored differences for presentation to the SISOs. There is also the ability to deal with multiple instances of the same data being processed at the same time. This structure manages the updates and the differences in such a manner that all calculations on a single piece of data that are processed in parallel are incorporated correctly in the new updated estimates.

The LDPC architecture of the present invention makes better use of memory and processing capacity during decoding. In the present invention, a single iteration consists of a single memory cycle. Two memories are disclosed. The first is a difference array which has a memory location for each of the ones in the H matrix, and the second is a current array which has a memory location for each of the columns in the H matrix. The current array may use high resolution memory, but the difference array requires only low resolution memory.

The LDPC architecture of the present invention requires the same number of memory cycles as the fast architecture of the Richardson architecture, but the present invention only requires the same number of memory locations as the slow architecture. Furthermore, the Richardson architectures require the larger memory to have higher resolution, while the present invention requires only the small memory as the higher resolution. The result is that, even with the same number of memory locations as the slow architecture of Richardson, the number of memory bits required by the present invention is less than required by even the slow architecture of Richardson.

Another significant difference between the present invention and the Richardson architectures is how permutations are handled. The Richardson architecture stores all the variable messages in their unpermuted form and the check messages in their permuted form. This requires a permutation block for each memory access. The architecture of the present invention represents the differences in their permuted form, and the variable nodes are stored in the same permutation as the last time they were accessed. They are permuted to the correct orientation each time they are used. The consequence is that only one permutation is required per iteration instead of the two required by the Richardson architecture. This is a significant savings, as the permuter is a fairly large function.

BRIEF DESCRIPTION OF THE DRAWINGS

FIG. 1 is a representative parity check matrix (H-Matrix).
FIG. 2 shows a signed magnitude data structure.
FIG. 3a is a decoder architecture with no parallelism.
FIG. 4 shows all permutation transformations for 3 variables.
FIG. 5a shows an expanded H-Matrix with permuted sets.
FIG. 5b shows the H-Matrix of FIG. 5a without the zero blocks, for greater clarity.
FIG. 6 is a matrix of permutations as an alternate representation for the H-matrix in FIG. 5a.
FIG. 7 is a third alternate representation for the H-matrix showing the equations as sums of the input sets linked with their permutation.
FIG. 8 is a table showing the result of two permutations.
FIG. 9 shows the contents of the CA for each iteration of the expanded code.
FIG. 10 shows the contents of the DA for the expanded code.
FIG. 13 shows sets of inputs.
FIG. 14 shows sets of Current estimates.

DETAILED DESCRIPTION OF THE PREFERRED EMBODIMENTS

1. The Coding Process

Figure 3B:
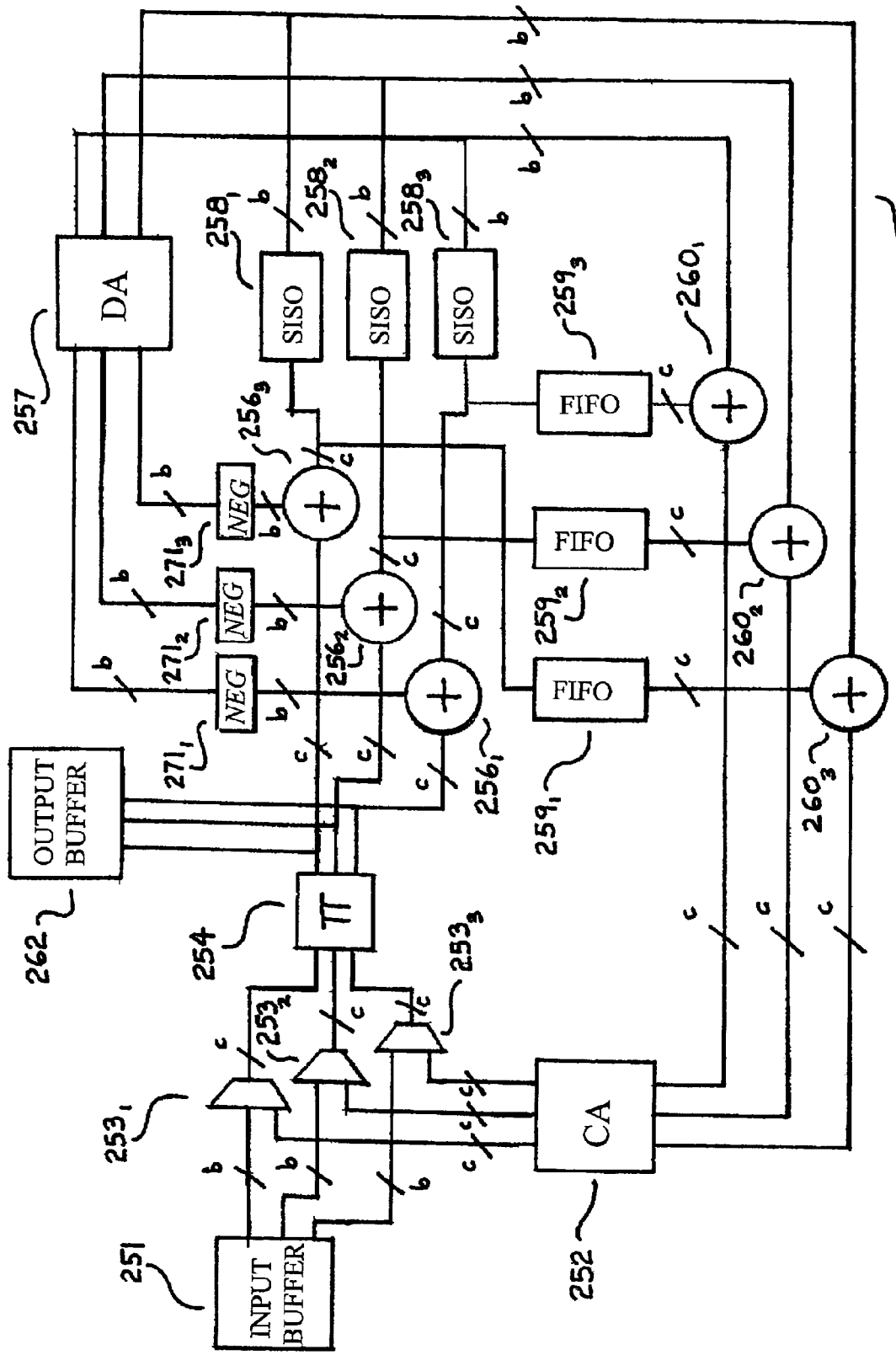
FIG. 3b is a decoder architecture for expanded codes which allows for parallel processing of data.

Communication systems often use forward error correction to correct errors induced by noise in a transmission channel. In such forward error correction systems, the detection and correction of errors occur at the receiver. Bits received through the channel are detected at the receiver as "soft" values. A soft value represents the "best guess" that the receiver can make for the value of the bit that was sent and the confidence in that guess. In essence, data is sent as a single bit, and received as a multi-bit sample. During transmission, a single bit of data may pick up noise, so that it is necessary to use more than a single bit to identify the sampled data. For example, in a binary system, if a "1" is coded as 5 volts and a "0" as 0 volts, then each can be represented with a single bit. If a value of 4.2 volts is received, then this is close to representing a "1", but the receiver will use multiple bits to represent how close to the 5 volts the sampled data resides.

A typical format for the received data is signed magnitude, where the first bit is a sign bit representing the hard decision data, and the remainder of the bits represent the confidence in the hard decision bit. A "hard decision" is a single bit. In the example set out immediately above, the receiver reads 4.2 volts, but could output a "1" as a hard decision, which would indicate 5 volts. This is shown in FIG. 2 with the <hd> field 233 being a single bit hard decision, and the <lvl> field 234 being a multi-bit confidence level. The signed magnitude is positive if the <hd> bit 232 equals one, and is negative if the <hd> bit 235 equals zero. An example of the signed magnitude format may be illustrated as follows:

| | sign <hd> | magnitude <lvl> | |
|---|---|---|---|
| e.g. | 1 | 00111 | (representing a positive 7) |
| e.g. | 0 | 00111 | (representing a negative 7) |

A type of forward error correction is low density parity check codes (LDPC). Low Density Parity Check codes are codes that have a "sparse" H-Matrix. A sparse H-Matrix is one in which there are many more zeroes than ones in the H-Matrix. For illustration here, a representative (non-sparse) H-Matrix 201 is shown in FIG. 1. The associated input vector "I" 209, representing the inputs $i_k$ 210, and the current estimate of the sent data, vector "C" 220, are shown in FIG. 1 as well. Each row 202 of the matrix represents a parity equation. Each row is identified as the "ith" row, $row_i$ 202. In FIG. 1, there are five rows 202, row 0 through row 4, in the exemplary H-Matrix. The number of inputs i 210 is equal to the number of columns in the H-matrix. In FIG. 1, there are ten columns in the exemplary H-Matrix; so, there are ten inputs $i_k$ 210, $i_0$ through $i_9$. The elements of the H-matrix are referred to as $H_{i,k}$ 200, which is the element in row i and column k.

In practice, an H-matrix will be much larger than the exemplary matrix of FIG. 1, and will have many hundreds if not thousands of data bits. By way of background information, an LDPC code is defined as "regular" if the H-matrix has the same number of 1's in each column and the same number of 1's in each row, and is "irregular" if it does not have the same number of ones in either the rows, the columns, or both. LDPC decoders work on "soft" channel data and are iterative in nature.

2. The SISO

As noted above, inputs are received in a signed magnitude representation. The inputs are stored in an input buffer 251 in FIG. 3a.

In its basic operation, the "Soft-In-Soft-Out" ("SISO") function of an LDPC decoder evaluates each of the parity equations $row_i$ 202, represented by the rows 202 of the H-Matrix 201 using the current estimates C 220, and if the parity equation is satisfied, will increase the confidence of the current estimates $c_k$ 221 for those current estimates $c_k$ 221 related to $row_i$ 202. If the parity equation $row_i$ 202 is not satisfied, the confidence of each current estimate $c_k$ 221 related to $row_i$ 202 will be decreased. It is possible to decrease the confidence to the point that a current estimate's hard decision bit is actually flipped, producing a correction of erroneous data.

The parity equations that the SISO evaluates are determined by the multiplication of the H-Matrix 201 by the input vector I 210 and the multiplication of the H-Matrix 201 by the current estimate vector C 220. This multiplication yields the parity equations $$i_0+i_1+i_3+i_5+i_9$$
$$i_1+i_2+i_4+i_5+i_6$$
$$i_0+i_2+i_3+i_6+i_7$$
$$i_0+i_1+i_4+i_7+i_8$$
$$i_2+i_3+i_4+i_8+i_9$$

for the inputs and the parity equations $$c_0+c_1+c_3+c_5+c_9$$
$$c_1+c_2+c_4+c_5+c_6$$
$$c_0+c_2+c_3+c_6+c_7$$
$$c_0+c_1+c_4+c_7+c_8$$
$$c_2+c_3+c_4+c_8+c_9$$

for the current estimates.

For each evaluation of a parity equation, the SISO outputs a difference for each of the inputs. This value is the difference between the input to the SISO and the estimate that this particular equation provides for that data. Referring to FIG. 3a, this difference is stored in the Difference Array ("DA") memory 257, as it is needed in subsequent evaluations of the same equation. The difference is also sent to an adder 260, where it is added to the data stored in the FIFO 259. This data is stored in the Current Array, "CA". Let $c_k$ represent the current best estimate of the kth input to the decoder, and let $d_{i,k}$ represent the change in confidence to $c_k$ according to parity equation i. The estimate $c_k$ is stored in CA 252 and estimate $d_{i,k}$ is stored in DA 257.

The SISO 258 takes as inputs all the inputs identified by a row in the H-Matrix. As an example, for row 0 of the matrix in FIG. 1, inputs 221 $c_0$, $c_1$, $c_3$, $c_5$, and $c_9$ are selected. The SISO 258 outputs a difference for each of the inputs; these are designated as $d_{0,0}$, $d_{0,1}$, $d_{0,3}$, $d_{0,5}$ and $d_{0,9}$ respectively. These are both stored into the DA memory 257, and added 260 to the original SISO inputs. The outputs of this adding operation are then stored back into the CA 252, replacing the values that were used in the equation.

After one complete iteration cycle, each of the parity equations, row 0 through row 4, will have been evaluated once, and the contents of the CA will be as follows:

$$c_0'=c_0+d_{0,0}+d_{0,2}+d_{0,3}$$
$$c_1'=c_1+d_{1,0}+d_{1,2}+d_{1,3}$$
$$c_2'=c_2+d_{2,1}+d_{2,2}+d_{2,4}$$
$$c_3'=c_3+d_{3,0}+d_{3,2}+d_{3,4}$$
$$c_4'=c_4+d_{4,1}+d_{4,3}+d_{4,4}$$
$$c_5'=c_5+d_{5,0}+d_{5,2}$$
$$c_6'=c_6+d_{6,1}+d_{6,2}$$
$$c_7'=c_7+d_{7,2}+d_{7,3}$$
$$c_8'=c_8+d_{8,3}+d_{8,4}$$
$$c_9'=c_9+d_{9,4}+d_{9,0}$$

The result $c_k'$ is the new value for $c_k$ which is stored back in the CA 252 after the iteration. The old value of $c_k$ is overwritten by the new value.

The CA 252 will contain n signed magnitude values and the DA 257 contains as many signed magnitude values as there are 1's in the H-Matrix 201. In the above example, the DA 257 will have 25 entries, and the CA 252 will have 10.

a. SISO Inputs/Outputs

The data structure for $c_k$ and $d_{i,k}$ is shown in FIG. 2. The bit <hd> 233 is the hard decision value, and <lvl> 235 is a multi-bit confidence value where the higher the value, the higher the confidence. The function $hd(c_k)$ returns the hard decision value of $c_k$, i.e., a "1" or a "0", and the function $lvl(c_k)$ returns the confidence value of $c_k$.

Sticky adder 256 is placed ahead of the SISO 258. The sticky add function is defined as follows:

$$A \oplus B = A+B \text{ if } A+B < MaxVal$$

$$A \oplus B = MaxVal \text{ if } A+B \geq MaxVal$$

$$MaxVal \oplus B = MaxVal \text{ for all } B$$

Where A and B are variables and MaxVal is the maximum value that can be handled. For example, if X and Y are 6 bit signed magnitude registers, then the lvl field is a 5 bit number and the hd field is a single bit. If X is a positive 20 and if Y is a positive 15, then the binary value of X is 110100 and the binary value of Y is 101111. Then, $lvl(X) \oplus lvl(Y) = 31$.

There is an input $i_k$ 210 and a current estimate $c_k$ 221 associated with each column of the H-Matrix, and there is a difference associated with each non-zero entry in the H-Matrix; that is with every "1" entry. For example, when working on row 1 of the H-Matrix 201 in FIG. 1, the non-zero k's are {1,2,4,5,6}. Each row of the H matrix represents one parity equation. When evaluating the equation represented by row$_i$ 202, the SISO takes as input $t_k$ where $$t_k = c_k \oplus (-d_{i,k}) \text{ for all k where } H_{i,k}=1$$

The value $t_k$ is the output of adder 256 in FIG. 3a. It has the data structure that is shown in FIG. 2. From the adder 256, $t_k$ is presented to the SISO 258, as well as stored in the FIFO 259.

The purpose of the SISO is to generate the differences. The differences are the differences between each input and current estimate as identified by the particular row equation being worked. The differences are defined by the following sets of equations:

$$\text{CORRECT} = \sum_k hd(t_k) \text{ where addition is over } GF(2).$$

$MinVal_1 = min(lvl(t_k))$ for all k
$v=k: lvl(t_k)=MinVal_1$
$MinVal_2 = min(lvl(t_k))$ for all $k \neq v$
$hd(d_{i,k})=hd(t_k)+$CORRECT where addition is over GF(2)
$lvl(d_{i,v})=MinVal_2$
$lvl(d_{i,k})=max(0, MinVal_1-f(MinVal_2-MinVal_1))$ for $k \neq v$
with the function $f(MinVal_2-MinVal_1)$ is defined such as:

$$f(x) = f(MinVal_2 - MinVal_1) = \begin{array}{l} 3 \\ 2 \\ 1 \\ 0 \end{array} \text{ for } \begin{array}{l} x < 2 \\ 2 \le x < 4 \\ 4 \le x < 8 \\ 8 \le x \end{array}$$

The output of the SISO is $d_{i,k}$. This value of $d_{i,k}$ replaces the value that was read from the DA. The value of $c_k$ that was read from CA is replaced with $t_k \oplus d_{i,k}$ for all k.

b. The Minimum Function

Figure 11A:
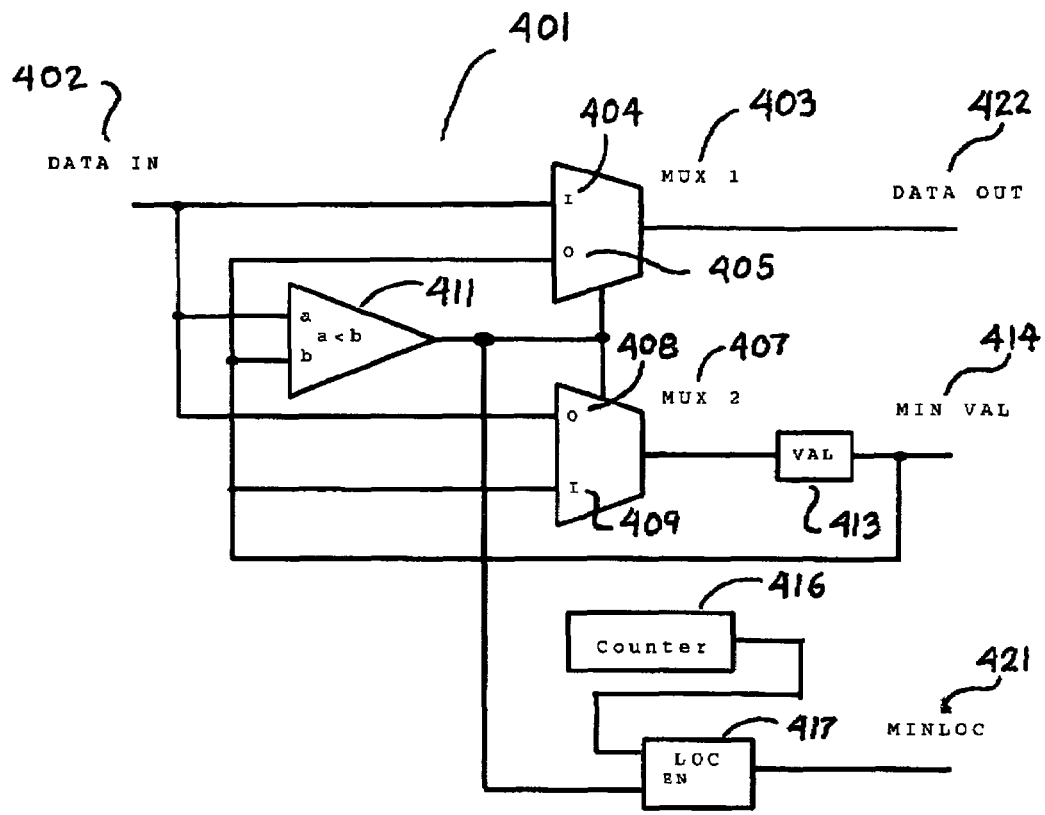
FIG. 11a shows a circuit that finds the minimum value in a sequential list of values, and passes all the non-minimums through. It also gives the sequence number in the list of the minimum value.
Figure 11B:
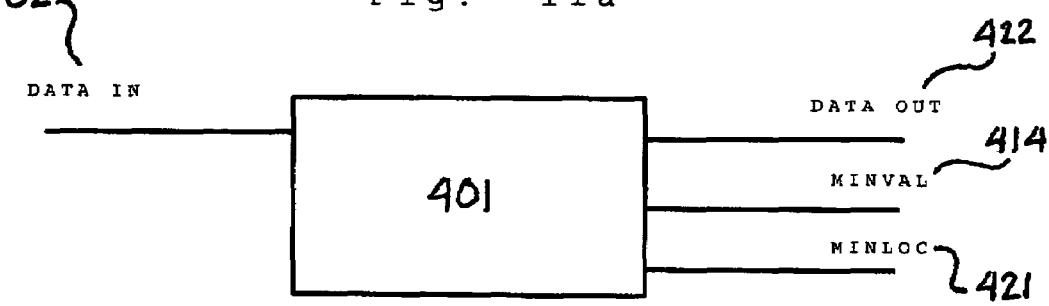
FIG. 11b shows the minimum function block.

FIGS. 11a and 11b are block diagrams showing the minimum function of the present invention. FIG. 11b shows the input and outputs of the minimum function block 401, and FIG. 11a shows the details of the minimum function block 401. The minimum function finds the minimum number in a list of numbers. The minimum number will be presented on the output MinVal 414 of the minimum function block 401. The sequence number of the minimum number will be presented on the output MinLoc 421. All other numbers in the sequence are passed through the minimum function block unchanged 422.

The minimum function block is initialized by having the counter 416 set to zero and the Val register 413 set to the maximum possible value with a preset which initializes the Val register 413 to all ones. The numbers are input on the Data_in line 402. This value is presented to the "a" input of the comparator 411. The "b" input of the comparator 411 is the current minimum value. After initialization, this is the maximum possible number. If "a" is less than "b", then Mux 1 403 passes the Val register value to the output Data_out 422. Mux 2 407 passes the Data_in input 402 to the input of the Val register 413, where it is saved. If "a" is not less than "b", then Mux 1 403 passes Data_in to the output Data_out 422. Mux 2 407 passes the contents of the Val register back to the Val register 413, in effect, leaving it the same.

As noted above, the counter 416 is initially set to zero. Every time new input is brought in, the counter is incremented. If Data_in 402 is less than the value stored in the Val register 413, the value of the counter 416 is latched into the Loc register 417. This corresponds to a new minimum value being stored in the Val register 413.

Once a sequence of numbers have passed through the minimum function block, the output MinVal 414 has the minimum value and the output MinLoc 421 has the location in the sequence of the minimum value.

By way of example, if the sequence {14,16,10,10} were passed through the circuit, the following would occur. The counter 416 is initialized to zero and the Val register 413 is initialized to a maximum value. The number 14 is input. 14 is less than a maximum value, so 14 gets placed in the Val register 413, the number 0 is placed in Loc 417, and the maximum value is passed to the output Data_out 422 and the counter 416 is incremented to 1. Then the number 16 is input 16 is larger than the 14 that is in Val 413 register, so the Val register 413 maintains its value of 14, the register Loc 417 maintains its value of 0, 16 is passed to the output Data_out 422 and the counter 416 is incremented to 2. Then the number 10 is input. 10 is less than the 14 that is in Val register 413, so the Val register 413 is changed to 10, the number 2 is placed in Loc 417, 14 is passed the out Data_out 422 and the counter 416 is incremented to 3. Then the second number 10 is input. The second 10 is not less than the first 10, so the 10 that is in Val register 413 stays the same, the value of Loc 417 does not change, the second 10 is passed out Data_out 422 and the counter 416 is incremented to 4. As this is the end of the sequence, the MinVal output 414 is 10 and the MinLoc output 421 is 2.

c. Details of the SISO

Figure 12A:
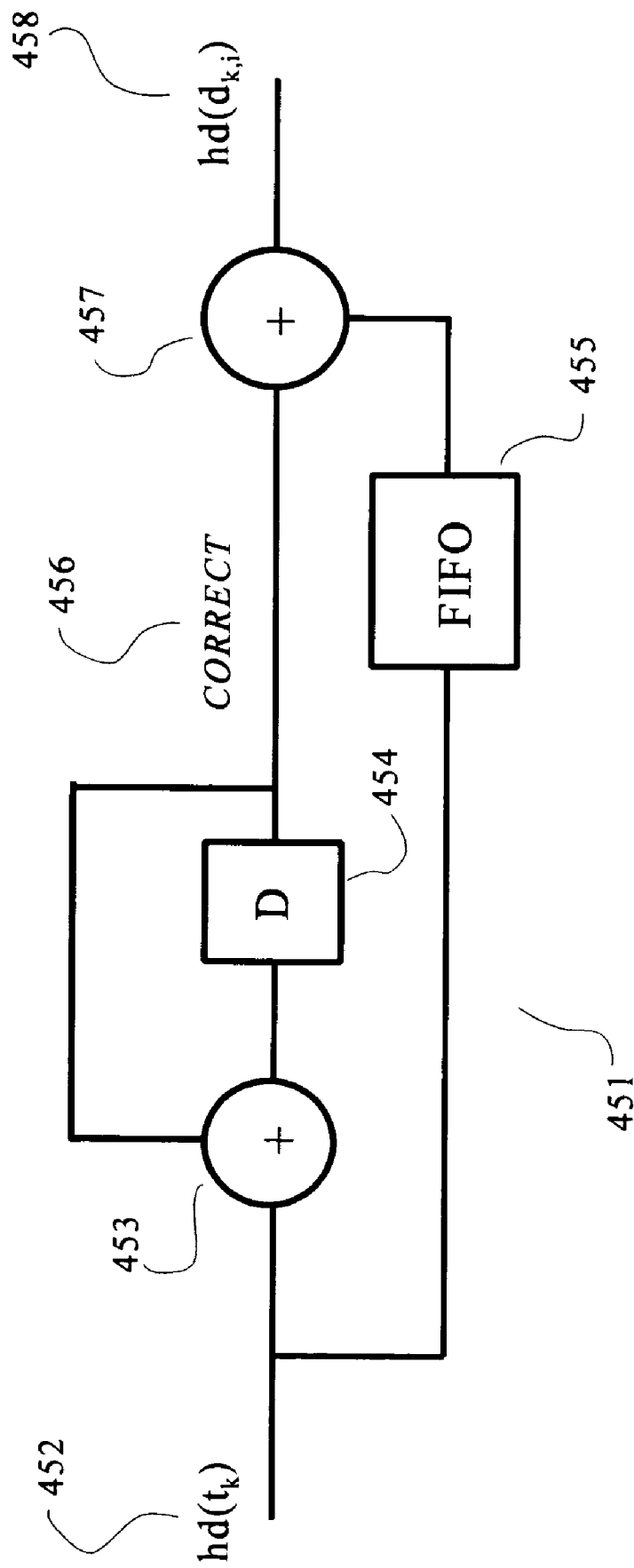
FIG. 12a shows the sign bit path of the SISO circuit.
Figure 12:
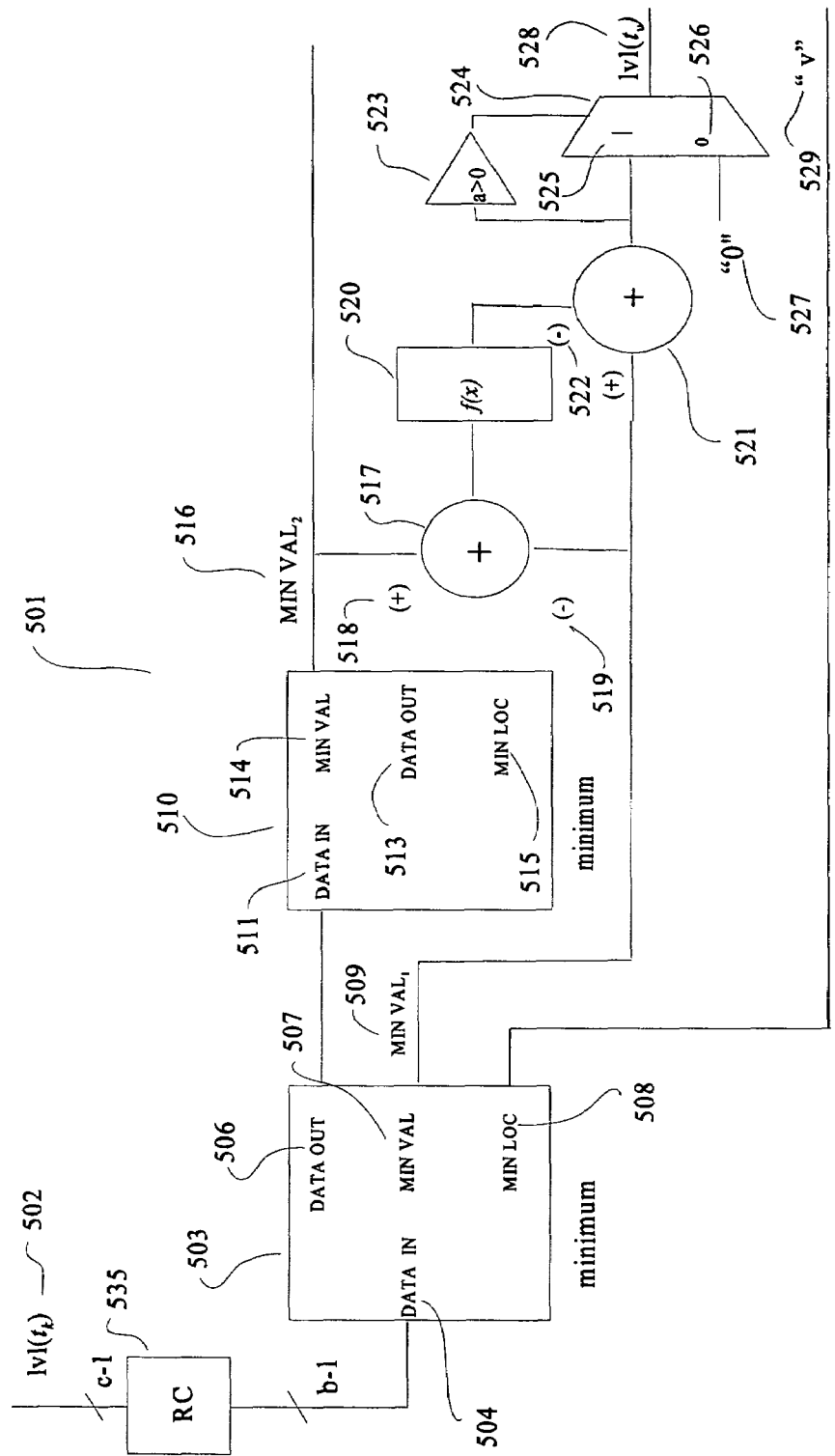
FIG. 12b shows the magnitude field path of the SISO circuit.

The SISO is shown in FIGS. 12a and 12b. It takes as its input the string of $t_k$'s. Each of the values is a signed magnitude number. These inputs are $hd(t_k)$ 452 in FIG. 12a, which is the sign bit, and $lvl(t_k)$ 502 in FIG. 12b, which is the magnitude portion of the number. The SISO deals with these portions separately, and they are recombined at the output. As such, they will be dealt with as separate data paths. FIG. 12a is the sign bit data path and FIG. 12b is the magnitude field data path.

First consider the sign bit data path in FIG. 12a. The flip flop 454 in FIG. 12a is initialized to 0. As each sign bit is input, it is exclusive-or'd with contents of the flip flop 454 and the result is placed in the flip flop 454. After all the $hd(t_k)$'s 452 are input, the flip flop 454 contains the exclusive-or of all the sign bits. This is the signal named "CORRECT" 456. Each of the sign bits are also stored in a FIFO 455. Once all the $hd(t_k)$'s 452 have been input, the CORRECT bit 456 is fixed. This bit is exclusive-or'd with each of the sign bits that has been stored in the FIFO. These become the sign bits for the new $hd(d_{i,k})$'s 458 that are output from the FIFO 455. Thus, if the parity of the inputs is even, each of the new $hd(d_{i,k})$'s 458 will have the same sign as the respective $hd(t_k)$ 452. If the parity of the inputs is odd, then each of the new $hd(d_{i,k})$'s 458 will have the opposite sign as the respective $hd(t_k)$ 452.

The magnitude or confidence data path is shown in FIG. 12b. The confidence values of the $lvl(t_k)$'s 502 are brought into the block c-1 bits wide. They are converted to b-1 bits wide in the resolution converter block RC 535. If the most significant c-b bits are zero, then the least significant b-1 bits are passed through unchanged. If any of the most significant bits are 1, then the least significant b-1 bits are set to 1. In effect, if the input $lvl(t_k)$ 502 can be represented with b-1 bits, then it is so represented, otherwise, it is set to the maximum value that can be represented with b-1 bits. This output is input to a first minimum block 503 where both the minimum value, $MinVal_1$ 507, and it's location, "v" 529, are found and stored for outputs. The Data_out 506 from the first minimum block 503 is the input 511 to the second minimum block 510, where the second lowest value of the string of confidences is found.

The first sum block 517 takes $MinVal_1$ 509 and $MinVal_2$ 516 as inputs, with $MinVal_1$ 509 as a negative input 519. The output of the first sum block 517 is input to the f(x) block 520. The f(x) block 520 has A function listed SUCH as $$f(x) = \begin{array}{l} 3 \\ 2 \\ 1 \\ 0 \end{array} \text{ for } \begin{array}{l} x < 2 \\ 2 \le x < 4 \\ 4 \le x < 8 \\ 8 \le x \end{array}$$

This output is input to the second sum block 521 as a negative input 522. The other input is $MinVal_1$ 509. The output of this second sum block 521 is input to a comparator 523, as well as input to a Mux 524. The Mux 524 has a second input which is a zero value 527. The comparator 523 tests to see if the input is greater than 0. The output of the comparator 523 is the select input of the Mux 524. If the comparator 523 tests true, then the output of the second sum block 521 is passed to the output as the $lvl(t_k)$ output 528. If the comparator; 523 is false, then the zero input 527 is passed to the output as the lvl($t_k$) output 528. Finally, MinVal 516 is passed to the output as the MIN(lvl($t_k$)) output for k equal to v.

In summary, referring to FIG. 3a, when a row is being evaluated, all the differences associated with that row are removed from the current best estimates prior to evaluating the new differences. This result is also stored in the FIFO 259. The new differences are stored in DA 257 and also added 260 with the output of the FIFO 259 prior to being stored back into CA 252. For any row operation, this amounts to a replacement of the current estimate or the current difference with the new estimate or the new difference.

FIG. 3a shows a circuit that performs this function.

3. Expanded Code

The H-Matrix in FIG. 1 can be viewed as a mother code. Each of the 1's in that H-Matrix can be replaced with an m×m permutation matrix and each zero can be replaced with an m×m zero matrix. This will allow the decoder to operate on sets of inputs m at a time. The decoder will access differences m at a time, current estimates will be accessed m at a time, and there will be m SISO's. The parameter m is known as the set size of the decoder.

Figures 5A, 5B:
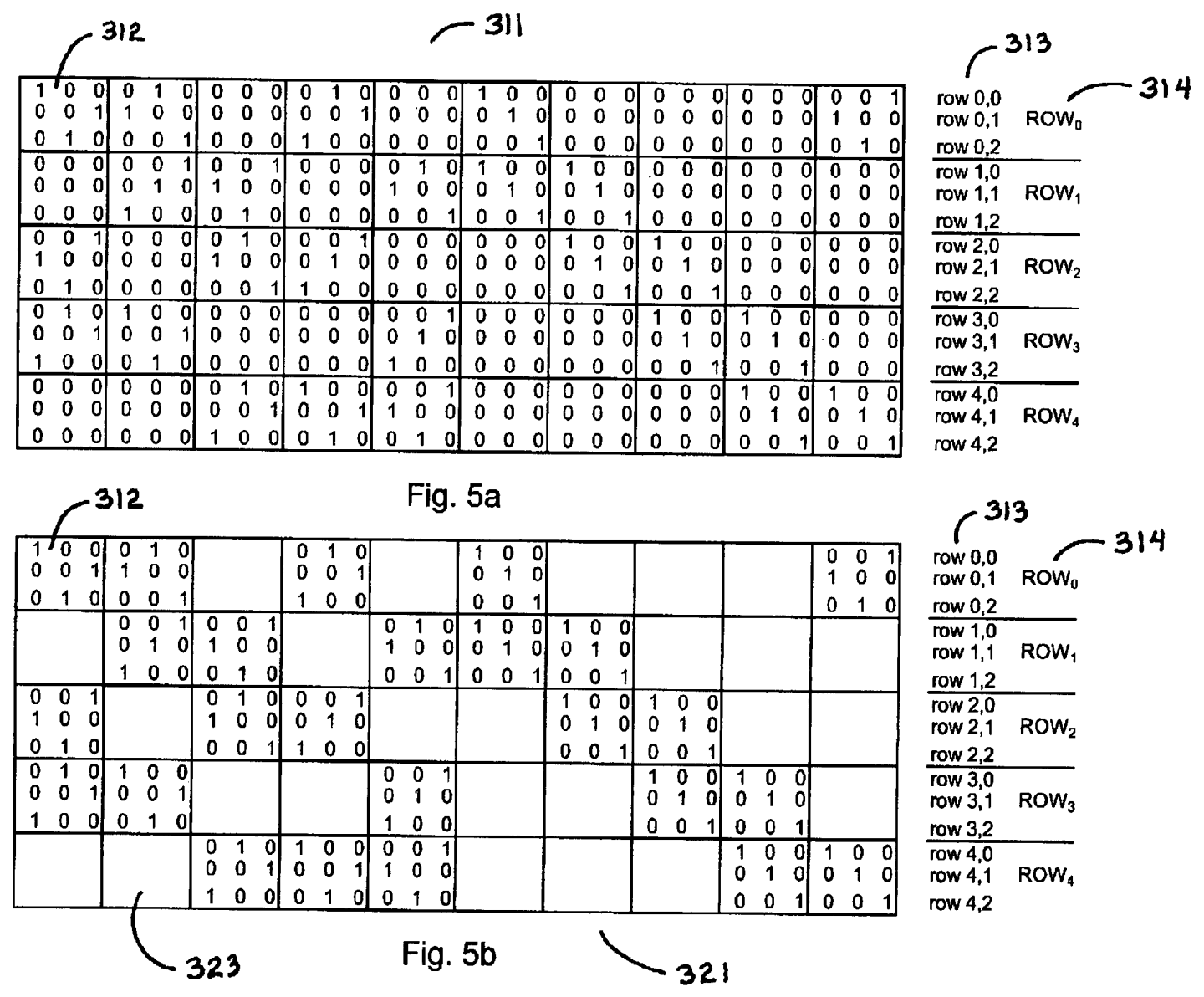

As an example, let m=3. In such a case, there are 6 possible permutations, any of which can be used. These permutations are shown in FIG. 4, which also illustrates the effect of a permutation. For example, with Permutation $P_2$, the input of abc is permuted to acb. An example of an expanded H-matrix with each of the permutations included is shown in FIG. 5a. In FIG. 5b, the 3×3 zeros have been blanked out for clarity.

FIG. 8 shows the effect of a permutation on a set that is already permuted. The columns of "A" permutations 361 are mapped against the rows of "B" permutations 362. Thus, for example, if A permutation 361 is permutation $P_2$, the second column, is followed by permutation $P_3$, the B permutation 362 in the third row, that has the same effect as permutation $P_4$. As another example, permutation $P_3$ followed by permutation $P_2$ has the same effect of permutation $P_5$. If a block is sitting in permutation $P_x$ and needs to be mapped to permutation $P_y$, the table in FIG. 8 can be used to determine the necessary permutation to apply. For example, if a block is in permutation $P_4$, and needs to end up in permutation $P_2$, looking at the table, it will be seen that permutation $P_3$ will give the desired result. As a second example, if a block is in permutation $P_5$ and needs to end up in permutation $P_1$, then permutation $P_4$ will accomplish that result.

Each of the equations, the differences, the inputs and current estimates will be grouped in sets of m. Looking at the Matrix in FIG. 5b, row$_{i,j}$ is the jth row in set Row$_i$. Input $i_{k,l}$ is the lth input in set $I_k$. This grouping is shown in FIG. 13, and is analogous to the current estimate, which is shown in FIG. 14. Thus, referring to FIG. 13, input $i_{k,l}$ 552 is the lth input in set $I_k$ 553; referring to FIG. 14, input $c_{k,l}$ 560 is the lth current estimate in set $C_k$ 563. The differences are also grouped into sets of m. The individual differences have been referred to as $d_{i,k}$. The set of differences associated with Row$_i$ and $C_k$ are referred to as $D_{i,k}$. There are m differences, again associated with the ones in the H-Matrix.

Another exemplary representation for the H-matrix is shown in FIG. 6. Each zero represents a 3×3 zero matrix, e.g. 331, and each number represents the 3×3 permutation matrix, e.g. 332, from FIG. 4. Thus, the number in FIG. 6 refers to one of the six possible permutations, $P_1$ through $P_6$, identified in FIG. 4. For example, in the first row and first column of FIG. 6, permutation 2, or $P_2$, is identified. In permutation 2, the input "abc" is permuted to the output "acb". The 3×3 matrix for $P_2$ is:

| 1 | 0 | 0 |
|---|---|---|
| 0 | 0 | 1 |
| 0 | 1 | 0 |

Finally, a third representation is listed in FIG. 7. In this case, each row 342 represents three equations. Each equation has 5 terms 341, where the term (k,m) 343 indicates that it is input set k with permutation m.

The purpose of the decoder architecture is to allow parallel solution of equations and allowing for a wider memory structure and reads that are more than one input wide. The decoder shown in FIG. 3b will accomplish this. The data paths are each m-inputs wide. The exemplary parallel architecture shown in FIG. 3b illustrates parallelism by showing three parallel paths. These three parallel paths lead to three parallel SISO's, $258_1$, $258_2$, and $258_3$. However, the use of three parallel paths is merely illustrative, and the invention may, and usually will, employ many more paths. Thus, the use of three paths in this disclosure is not limiting, but exemplary.

The DA 257 is the memory that holds all the $D_{i,k}$'s. They are in groups of m, and stored in the "proper" order, where the "proper" order means the permutation indicated by that permutation matrix of FIG. 6. Anytime a current estimate is brought to an adder $256_{1-3}$ to have the differences subtracted, the current estimate is permuted to the same permutation as $D_{i,k}$. As an example, the contents of $D_{0,0}$ for the matrix in FIG. 5b are stored in the order {1,3,2}, as indicated by the permutation $P_2$.

An example working through two complete iterations for the code defined by the H-Matrix in FIG. 5b and the decoder of FIG. 3b is given below. The first time an input is used, a mux $253_{1-3}$ selects the input 251; for subsequent uses of that "input", a mux $253_{1-3}$ selects the CA 252. Each of the inputs 251 arrives in permutation order $P_1$. Each of the $C_i$'s also need to be permuted to the proper order. An $I_0$ is permuted by $P_2$ and presented to a SISO $258_{1-3}$ as well as stored in a FIFO $259_{1-3}$. No difference is removed, as this is the initial pass through the decoder and the differences are all zero. The next inputs are $I_1$ permuted by $P_3$, $I_3$ permuted by $P_5$, $I_5$ permuted by $P_1$, and $I_9$ permuted by $P_4$.

Referring to FIG. 5b, and looking at just the equation represented by row$_{0,0}$, it requires inputs $i_{0,0}$, $i_{1,1}$, $i_{3,1}$, $i_{5,0}$ and $i_{9,2}$. By the same token, the equation represented by row$_{0,1}$ requires inputs $i_{0,2}$, $i_{1,0}$, $i_{3,2}$, $i_{5,1}$ and $i_{9,0}$ and the equation represented by row$_{0,2}$ requires inputs $i_{0,1}$, $i_{1,2}$, $i_{3,0}$, $i_{5,2}$ and $i_{9,1}$. Each of these inputs is presented to a proper SISO $258_{1-3}$, by the permutations referenced in the paragraph above.

The differences calculated by a SISO $258_{1-3}$ are stored in the DA 257 as $D_{0,0}$, $D_{0,1}$, $D_{0,3}$, $D_{0,5}$ and $D_{0,9}$. These differences are also added $260_{1-3}$ to the inputs stored in the FIFO $259_{1-3}$ and stored back in the CA 252. Note that the inputs are now stored back in the original location, but in a permuted form.

This exemplary architecture allows three SISO's, $258_1$, $258_2$, and $258_3$, to operate in parallel. The inputs are read three at a time.

As the equations for the remaining ROW$_i$'s are evaluated, there is always a choice in taking the input from $C_k$ or $I_k$. If $I_k$ has been used, then select $C_k$. If $I_k$ has not been used, then select $I_k$. This can be seen by examining ROW$_1$. $I_1$ has been used, so $C_1$ is selected by a mux $253_{1-3}$. $C_1$ needs to be permuted to $P_6$. However, it is already permuted by $P_3$. Permutation $P_4$ accomplishes this. Therefore, $C_1$ is permuted by $P_4$. $I_2$ has not been used, so it is selected by the mux $253_{1-3}$. $I_2$ is permuted by $P_4$. By the same token, $I_4$ has not been used, so $I_4$ is permuted by $P_3$, $I_5$ has already been used, so $C_5$ is selected by the mux $253_{1-3}$ and permuted by $P_1$. $I_6$ has not been used, so $I_6$ is selected by the mux $253_{1-3}$ and permuted by $P_6$. Note that inputs $I_2$, $I_4$ and $I_6$ were in their initial states, as they had not yet been permuted. With respect to the three SISO's, $SISO_0$ $258_1$ gets $i_{1,2}$, $c_{2,2}$, $i_{4,1}$, $c_{5,0}$ and $i_{6,0}$; $SISO_1$ $258_2$ gets $i_{1,1}$, $c_{2,0}$, $i_{4,0}$, $c_{5,1}$ $_{and\ i6,1}$; $SISO_2$ $258_3$ gets $i_{1,0}$, $c_{2,1}$, $i_{4,2}$, $c_{5,2}$ and $i_{6,2}$.

The differences $d_{1,1}$, $d_{1,2}$, $d_{1,4}$, $d_{1,5}$ and $d_{1,6}$ are all initially zero. The new differences are stored in the DA 257. The differences are also added $260_{1-6}$ into the output of a FIFO $259_{1-3}$, which are then stored in the CA 252 as $C_1$, $C_2$, $C_4$, $C_5$ and $C_6$ respectively. This continues for $ROW_2$, $ROW_3$, and $ROW_4$, at which point each of the equations has been solved once. At this point, the DA 257 is filled with non-zero values.

In general, the proper permutation to perform on any $C_j$ can be determined by looking at the H-Matrix of FIG. 5b. Each $C_j$ is stored in the permutation required by the equation that used the $C_j$ previously. As an example, to determine the proper permutation for $C_4$ in $ROW_3$ equation, it can be observed the prior use of $C_4$ is in $Row_1$. The permutation that $C_4$ is stored in is $P_3$. Permutation $P_6$ is required, and $P_4$ is the permutation that accomplishes this. A second example would be $C_4$ in $ROW_2$. Except for the very first iteration, which has already been dealt with, $C_4$ will be stored in permutation $P_4$, which is seen by looking at $C_4$ in $ROW_4$. Permutation $P_6$ accomplishes the required permutation.

This architecture keeps the differences $D_{i,k}$ in the permutation that is seen in the H-Matrix of FIG. 5b. The inputs are originally in permutation $P_1$, which is no permutation. However, the permutation changes during the iterations. This can be seen in FIGS. 9 and 10. FIG. 9 identifies the permutation that each of the CA blocks is stored in after each of the 5 iteration steps. FIG. 10 shows the permutations for the DA memory. The required permutation at each step can be determined from these two figures. These document the permutation that the $C_k$ is stored in, and the permutation that is needed. FIG. 8, as seen earlier, can be used to determine the proper $P_x$ that is needed. For example, referring to FIG. 9, when working on $ROW_3$ equation, $C_0$ is stored in the $P_4$ permutation, which can be seen from the ROW 2 column. From FIG. 10 it may be seen that $D_{3,0}$ is stored in the $P_5$ permutation. Referring to FIG. 8, it can be seen that by applying permutation $P_4$ to $C_0$, it will be in the proper $P_5$ permutation. When the new $C_0$ is calculated, it is stored in the $P_5$ permutation.

To get the required outputs, everything needs to be permuted back to $P_1$. At the end of the last iteration, $C_0$ and $C_2$ are stored in permutation $P_5$, $C_1$ and $C_3$ are stored in permutation $P_2$, $C_4$ is stored in permutation $P_4$ and the rest are stored in permutation $P_1$. $C_0$ and $C_2$ are permuted by $P_4$, $C_1$ and $C_3$ are permuted by $P_2$, $C_4$ is permuted by $P_5$ and the rest are permuted by $P_1$. This gets all the outputs into the required $P_1$ permutation.

4. Multiplicity Architecture

One of the conditions that can occur in a code is when the same set of inputs is used more than once in the same set of equations. The input sets will occur with different permutations. An example would be to replace the second term in $ROW_0$ with (3,4). The equation becomes $$Row\ I=(0,2)+(3,4)+(3,5)+(5,1)+(9,4)$$

Figure 15:
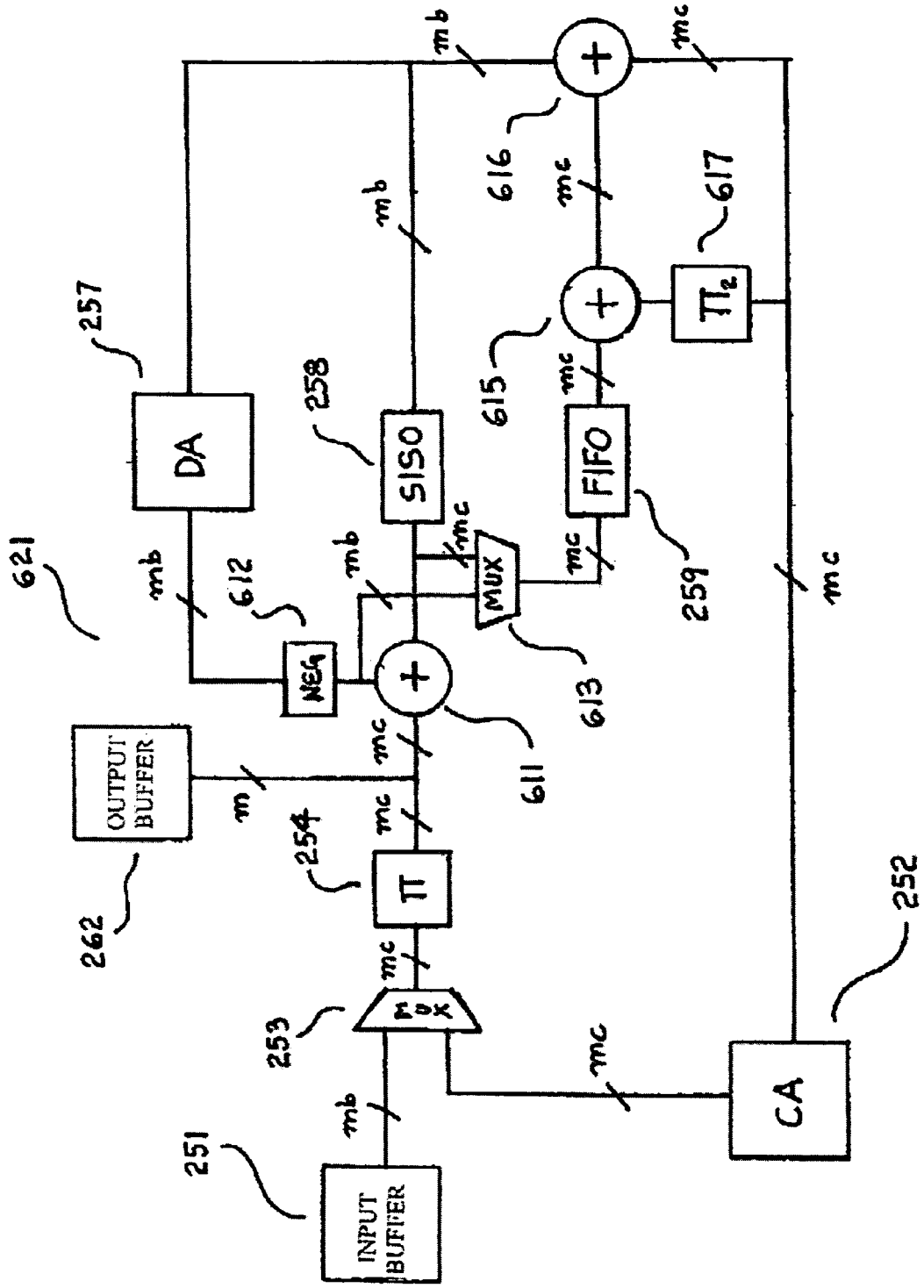
FIG. 15 is a decoder architecture for expanded codes with the additional feedback path for handling multiplicities.

This requires $I_3$ to be used twice in the first iteration, followed by $C_3$ being used twice in subsequent iterations. The terms (3,4) and (3,5) are called "multiplicities" and occur when the same set of inputs are used in the same equations more than once. When this occurs, the input set will always occur with different permutations. There is a difference stored in the DA for each of these permutations. In the above example, the first difference has permutation $P_4$, and the second difference has permutation $P_5$. $D4_{0,3}$ will represent the difference set $D_{0,3}$ with permutation $P_4$ and $D5_{0,3}$ will represent the difference set $D_{0,3}$ with permutation $P_5$. In general, $Dy_{i,k}$ will represent the set associated with the equation for $ROW_i$ and the input set $C_k$ in permutation $P_y$. Each of these is a separate set of differences, and will be stored separately in the DA 257. However, both differences require the same input, which is not permitted. In the first iteration, the input vector I 251 will be selected by the mux 253, and in subsequent iterations the current estimates C will stored in the CA 252 will be selected by a mux $253_{1-3}$. The output of the mux 253 minus the first difference will be stored in a FIFO $259_{1-3}$, as well as the output of the mux $253_{1-3}$ minus the second difference. After doing multiple operations on the same $C_k$ in the same iteration, the decoder in FIG. 3b is not capable of storing the proper value back in the CA 252. This is remedied by adding a feedback path, which is shown in FIG. 15. FIG. 15 shows an exemplary parallel system of width m. Thus, the system may use m parallel SISO's 258 to receive inputs from m paths. Similarly, the system may use m parallel mux's 253, m parallel adders 611, etc. In this way, FIG. 15 illustrates the parallelism of the present architecture in a manner distinct from the parallelism illustrated in FIG. 3b.

When processing $ROW_0$ for the first time, the first input is $I_0$ with a permutation of $P_2$. The second input is $I_3$ with a permutation of $P_4$. The third input is $I_3$, but with a permutation of $P_5$. The fourth and fifth inputs are $I_5$ and $I_9$ with permutations of $P_1$ and $P_4$ respectively. The inputs to a FIFO 259 are also different when dealing with repetitive sets in the same equation. The first time a set element is seen, the FIFO 259 receives $I_3-D4_{0,3}$. Recognize that $D4_{0,3}$ is zero, as this is the first pass, and the differences are initialized originally to zero. The next input 251 to the FIFO 259 will be $(-D5_{0,3})$. Again, $D5_{0,3}$ is equal to zero. Also, $D5_{0,3}$ is stored in a different location in the DA 257 than $D4_{0,3}$, which allows for the retention of both values. When $I_3-D4_{0,3}$ is output from the FIFO 259, the other input to the adder 615 will be equal to zero. The output of adder 1 615 goes to adder 2 616. The new $D4'_{0,3}$, which is output from the SISO 258, is added to the output of adder 1 615 using adder 2 616. This goes to the second permutation block 617, where it is permuted to $P_5$. Referring to FIG. 8, it can be seen that this is accomplished with permutation $P_4$. This is added 615 to the negative of the original difference $-D5_{0,3}$ as it is output from the FIFO 259, and added by adder 616 to the new difference $D5'_{0,3}$. This result is stored into the CA 252 in location $C_3$. The value that is stored is:

$$C'_3=C_3-D4_{0,3}+D4'_{0,3}+(-D5_{0,3})+D5'_{0,3}$$

This shows that both differences have been updated with the new values.

For subsequent iterations, $C_3$ will be stored in permutation $P_2$. In that case, when $ROW_0$ is evaluated, $C_3$ will first be brought in with permutation $P_3$, and second brought in with permutation $P_6$ to get the required permutations of $P_4$ and $P_5$ respectively.

In the multiplicity architecture shown in FIG. 15, the second permutation block 617 feeds a permuted version of the output of adder 2 616 back to be accumulated with the output of FIFO 259. In an alternative embodiment, the second permutation block 617 includes a delay. This delay provides the ability to pick more precisely the time of the feedback.

5. Processor Architecture

The architecture disclosed here arranges components as discrete components, but this is illustrative and not intended to be limiting. FIGS. 3a, 3b and 15 show the SISOs, FIFOs, DA, adders and CA, as separate blocks for illustrative purposes. This should not be construed as requiring a decoder with discrete components for these functions. For example, a decoder processor could integrate the SISO 258, FIFO 259 and second adder 260 of FIG. 3a into a single processor, or it could separate these functions into discrete components, and both arrangements would fall within the understanding of the invention disclosed and claimed here. Similarly, for example, the difference and new estimate functions of the SISO could be separated or integrated, and each arrangement would fall within the scope of the present invention.

The figures and description set forth here represent only some embodiments of the invention. After considering these, skilled persons will understand that there are many ways to make an LDPC decoder according to the principles disclosed. The inventors contemplate that the use of alternative structures or arrangements which result in an LDPC decoder according to the principles disclosed, will be within the scope of the invention.

The invention claimed is:

1. An iterative decoder structure allowing parallel evaluation of parity equations comprising:
   a. received data inputs,
   b. a permuter to receive the received data inputs and current array outputs, and to generate a permuter output,
   c. a first adder, wherein the first adder receives the permuter output as a first input to the first adder and a difference array output as a second input to the first adder and generates a first adder output,
   d. a processor, wherein the processor receives the first adder output and generates an estimate output and a difference output,
   e. a difference array, wherein the difference array receives the difference output and outputs a difference array output, and
   f. a current array, wherein the current array receives the estimate output and presents a current array output to the permuter.

2. The iterative decoder structure of claim 1, wherein the received data inputs have an original order, and wherein the estimate output has a final estimate, and wherein the final estimate is permuted back to the original order at a final evaluation.

3. The iterative decoder structure of claim 1, wherein the received data inputs and current array outputs are processed along parallel data paths.

4. The iterative decoder structure of claim 3, having a plurality of parallel first adders and processors arranged along the parallel data paths.

5. The iterative decoder structure of claim 1, wherein the estimate output of the processor can be an old difference where at least one of the received data inputs is used more than once in the parity equations being evaluated in parallel.

6. The iterative decoder structure of claim 5, further comprising a second permuter to receive and permute the estimate output of the processor, and wherein the second permuter output is an input to the processor.

7. The iterative decoder structure of claim 1, wherein the processor is further comprised of a SISO, a FIFO and a second adder.

8. The iterative decoder structure of claim 7, wherein the SISO outputs the difference output as a difference between a new estimate and a prior estimate.

9. The iterative decoder structure of claim 7, wherein the FIFO stores the first adder output and generates a FIFO output.

10. The iterative decoder structure of claim 9, wherein the second adder receives the difference output from the processor as a first input to the second adder, and wherein the second adder receives the FIFO output as a second input to the second adder, and wherein the second adder generates the estimate output for presentation to the current array.

11. An iterative low density parity check decoder, comprising:
   a. inputs comprising estimates of the values of the data inputs,
   b. a first adder means to receive the estimates and subsequent estimates and to generate a first adder output,
   c. a processor means to receive the first adder output and to generate a difference, wherein the processor means further comprises a means to calculate a new estimate and provide a processor estimate output,
   d. a difference memory means to store the difference and to present the difference to the first adder means, and
   e. a current memory means to receive a sum of the difference and the processor estimate output and to provide the subsequent estimate.

12. The iterative low density parity check decoder of claim 11, further comprising a means to handle multiplicities in the second adder output.

13. The iterative low density parity check decoder of claim 12, wherein the means to handle multiplicities further comprises a second permuter.

14. The iterative low density parity check decoder of claim 11, further comprising a means to transmit the subsequent estimates along parallel data paths.

15. The iterative low density parity check decoder of claim 14, further comprising a permuter means to permute the estimates and subsequent estimates and to generate a permuted output.

16. The iterative low density parity check decoder of claim 15, wherein the permuter means further comprises a means to permute the subsequent estimate back to an original order.

17. An apparatus for performing iterative low density parity check decoder operations, the apparatus comprising:
   a. estimates of the values of received data,
   b. a processor generating new estimates and generating differences between the new estimates and prior estimates,
   c. a first memory storing the differences,
   d. a second memory storing current estimates and providing a current estimate output, and
   e. an adder combining the differences and current estimate outputs for presentation to the processor as an adder output.

18. The iterative low density parity check decoder apparatus of claim 17, wherein the processor further comprises a SISO to process the new estimate and the difference.

19. The iterative low density parity check decoder apparatus of claim 18, further comprising a third memory to store the adder output and generate a third memory output for presentation to the second memory.

20. The iterative low density parity check decoder apparatus of claim 19, further comprising a second adder, wherein the second adder receives the differences from the SISO as a first input to the second adder, and wherein the second adder receives the third memory output as a second input of the second adder, and wherein the second adder generates a second adder output and provides the second adder output to the second memory.

21. The iterative low density parity check decoder apparatus of claim 17, wherein the estimates are processed by the decoder along parallel data paths.

22. The iterative low density parity check decoder apparatus of claim 21, further comprising a permuter reordering the current estimate outputs prior to presentation to the adder.

23. The iterative low density parity check decoder apparatus of claim 22, having a plurality of parallel permuters, adders and processors along the parallel data paths.

24. The iterative low density parity check decoder apparatus of claim 21, wherein the estimates have an original order and wherein the decoder has a final evaluation, and wherein the current estimate output is permuted back to the original order in the final evaluation.

25. The iterative low density parity check decoder apparatus of claim 24, wherein the new estimate output of the processor can be an old difference.

26. A method for performing iterative low density parity check decoder operations along parallel data paths, the method comprising the steps of:
   a. in an initial iteration, receiving data having an initial estimate,
      i. applying a parity equation on the initial estimate and generating a new estimate,
      ii. calculating a difference between the new estimate and the initial estimate,
      iii. storing the difference in a difference memory,
      iv. adding the initial estimate and the difference and producing a current estimate,
      v. storing the current estimate in a current estimate memory,
   b. in subsequent iterations,
      i. permuting the current estimates,
      ii. subtracting the difference from a prior current estimate to produce a subsequent estimate,
      iii. applying a parity equation on the subsequent estimate and generating a new current estimate,
      iv. calculating a new difference between the subsequent estimate and the new current estimate,
      v. storing the new difference in the difference memory,
      vi. adding the new difference and stored subsequent estimate and producing the current estimate for subsequent iterations, and
      vii. storing the current estimate in the current memory.

27. The method for performing parallel iterative low density parity check decoder operations of claim 26, wherein the initial estimate has an initial order, and further comprising the step of permuting the current estimate back to the initial order during a final iteration.

28. The method for performing parallel iterative low density parity check decoder operations of claim 26, further comprising the step of permuting the current estimate to avoid retrieving the current estimate in the current memory.

29. A method for performing iterative low density parity check decoder operations, the method comprising the steps of:
   a. storing a current estimate associated with received data in a current memory,
   b. subtracting a difference from the current estimate to provide a subtracted estimate,
   c. performing a parity equation on the subtracted estimate and generating a new difference and a new best estimate,
   d. storing the new difference in a difference memory,
   e. adding the subtracted estimate and the new best estimate and generating a new current estimate,
   f. overwriting the current estimate in the current memory with the new current estimate.

30. The method for performing iterative low density parity check decoder operations of claim 29, wherein the estimates are processed along parallel data paths.

31. The method for performing parallel iterative low density parity check decoder operations of claim 30, wherein the current estimate further comprises an initial estimate having an initial order, and further comprising the step of permuting the new current estimate back to the initial order during a final iteration.

32. The method for performing parallel iterative low density parity check decoder operations of claim 30, further comprising the step of permuting the current estimate to avoid retrieving the current estimate in the current memory.

33. The method for performing parallel iterative low density parity check decoder operations of claim 30, further comprising the step of permuting the new best estimate prior to generating the new current estimate.

34. The method for performing iterative low density parity check decoder operations of claim 30, further comprising a permuter reordering the estimates.

35. The method for performing iterative low density parity check decoder operations of claim 34, wherein the estimates are reordered prior to the step of subtracting the difference from the current estimate.

* * * * *